(12) United States Patent
Hankins

(10) Patent No.: US 7,597,819 B1
(45) Date of Patent: Oct. 6, 2009

(54) REDOX BUFFERED HYDROFLUORIC ACID ETCHANT FOR THE REDUCTION OF GALVANIC ATTACK DURING RELEASE ETCHING OF MEMS DEVICES HAVING NOBLE MATERIAL FILMS

(75) Inventor: Matthew G. Hankins, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 475 days.

(21) Appl. No.: 11/017,108

(22) Filed: Dec. 20, 2004

(51) Int. Cl.
*C09K 13/00* (2006.01)
(52) U.S. Cl. .................... 252/79.1; 216/2; 216/102; 438/48; 438/52
(58) Field of Classification Search .......... 216/2, 216/102; 438/48, 52; 252/79.1
See application file for complete search history.

(56) References Cited

U.S. PATENT DOCUMENTS

| | | | |
|---|---|---|---|
| 6,082,208 A | 7/2000 | Rodgers et al. | |
| 6,399,492 B1 * | 6/2002 | Andreas et al. | 438/682 |
| 6,743,078 B2 * | 6/2004 | McClain et al. | 451/41 |
| 6,916,429 B2 * | 7/2005 | Kool et al. | 216/104 |
| 6,949,397 B2 * | 9/2005 | Despont et al. | 438/52 |
| 2003/0119221 A1 * | 6/2003 | Cunningham et al. | 438/52 |
| 2004/0020568 A1 * | 2/2004 | Phelps et al. | 148/273 |
| 2004/0188785 A1 * | 9/2004 | Cunningham et al. | 257/415 |

OTHER PUBLICATIONS

Landolt Bornstein Organic Index (2006).*
Landolt Bornstein Organic Index (2006) pp. 1-4.*
Xia, Etching and Passivation of Silicon in Alkaline Solution: A Coupled Chemical/Electrochemical System, J. Phys. Chem. B 2001, 105, 5722-5729.
Kelly, Galvanic Cell Formation: A review of Approaches to Silicon Etching for Sensor Fabrication, IEEE Sensors Journal, vol. 1, No. 2, Aug. 2001.
Xia, Galvanic Cell Formation in Silicon/Metal Contacts: The Effect on Silicon Surface Morphology, Chem. Mater., 2000, 12, 1671-1678.
Ashruf, Galvanic etching for sensor fabrication, J. Micromech. Microeng. 10 (2000) 505-515.
Sniegowski, IC-Compatible Polysilicon Surface Micromachining, Annu. Rev. Mater. Sci. 2000, 30 299-333.
Deneke, Thiol-Based Antioxidants, Current Topics in-Cellular Regulation, vol. 36 (2000) 151-180.

(Continued)

*Primary Examiner*—Nadine Norton
*Assistant Examiner*—Maki Angadi
(74) *Attorney, Agent, or Firm*—Kevin W. Bieg

(57) ABSTRACT

Etchant solutions comprising a redox buffer can be used during the release etch step to reduce damage to the structural layers of a MEMS device that has noble material films. A preferred redox buffer comprises a soluble thiophosphoric acid, ester, or salt that maintains the electrochemical potential of the etchant solution at a level that prevents oxidation of the structural material. Therefore, the redox buffer preferentially oxidizes in place of the structural material. The sacrificial redox buffer thereby protects the exposed structural layers while permitting the dissolution of sacrificial oxide layers during the release etch.

19 Claims, 5 Drawing Sheets

OTHER PUBLICATIONS

Bertagna, Corrosion Rate of n- and p-Silicon Substrates in HF, HF+HCl, and HF+NH$_4$F Aqueous Solutions, Journal of the Electrochemical Society, 146 (1) 83-90 (1999).

Bühler, Silicon dioxide sacrificial layer etching in surface micromachining, J. Micromech. Microeng. 7 (1997) R1-R13.

Bertagna, Kinetics of electrochemical corrosion of silicon wafers in dilute HF solutions, Journal of Electroanalytical Chemistry, 422 (1997) 115-123.

Comizzoli, Electrochemical aspects of corrosion resistance and etching of metallizations for microelectronics, Materials Science and Engineering A198 (1995) 153-160.

Torcheux, Electrochemical Coupling Effects on the Corrosion of Silicon Samples in HF Solutions, J. of Electrochem. Soc., 142, 6, Jun. 1995, 2037-2046.

* cited by examiner

REDOX BUFFERED HYDROFLUORIC ACID ETCHANT FOR THE REDUCTION OF GALVANIC ATTACK DURING RELEASE ETCHING OF MEMS DEVICES HAVING NOBLE MATERIAL FILMS

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention is directed to etching of semiconductor devices and, more particularly, to a redox buffered hydrofluoric acid etchant for the reduction of galvanic attack on structural layers during the release etching a MEMS device having noble material films.

BACKGROUND OF THE INVENTION

The market for microelectromechanical systems (MEMS) has grown rapidly since their introduction in the 1990's with the development of airbag accelerometers and micro-mirror array chips. Often, these devices are uniquely capable of complex mechanical tasks. Within the last decade complex, integrated MEMS have been developed that comprise motors, movable mirror arrays, mechanical switches, integrated circuits (ICs), and fluidic flow channels. Small sensors and communication chips are being developed using similar technologies.

Formation of a MEMS device can include surface and bulk micromachining processes. Surface micromachining comprises building up, layer by layer, the MEMS device structure on the surface of a substrate. In particular, polysilicon surface micromachining uses the planar fabrication techniques common to microelectronic circuit fabrication to manufacture the MEMS device. The multiple layers are built up on the substrate (e.g., a single crystal silicon wafer) using thin film depositions of low-stress polycrystalline silicon (poly-Si) as a structural material and silicon dioxide ($SiO_2$) as a sacrificial material. Silicon dioxide is a preferred sacrificial material due to its wide use in IC processing, thermal compatibility during the high temperature deposition and anneal of poly-Si, and because it can be selectively etched with respect to silicon and some metals. In addition, $SiO_2$ is a dielectric material that can be used for electrical insulation. $SiO_2$ layers can be thermally grown or deposited by chemical vapor deposition. Photolithographic patterning and dry etching are generally used to define surface features in the deposited structural layers in a plane parallel to the substrate. Vias etched through the sacrificial layers provide anchor points between the structural layers and the substrate. Wet etching with a selective etchant can then be used to remove the sacrificial oxide layers and release the MEMS device. Alkaline $SiO_2$ etchants also react with silicon. Therefore, acid etchants comprising hydrogen fluoride (HF) are typically used to selectively etch the $SiO_2$ sacrificial layers. Typically, HF is highly selective between the sacrificial oxide and the poly-Si structural layers, and has a high etch rate. However, oxide etch rate and selectivity can depend on a number of factors, including the presence of chemical impurities (e.g., dopant concentration, etchant contaminants, etc.), film density, intrinsic stress, microstructure, etc.

Many hundreds of fully assembled MEMS devices can thereby be batch-fabricated on a single silicon substrate. Quite complex structures can be built up using the polysilicon surface micromachining process described above, enabling the construction of highly functional MEMS devices. The total stack height of the MEMS device structure can be about 10 microns or greater. A typical polysilicon surface micromachining process is the five-level polysilicon process described in U.S. Pat. No. 6,082,208 to Rodgers et al., and J. J. Sniegowski and M. P. de Boer, "IC-Compatible Polysilicon Surface Micromachining," *Ann. Rev. Mater. Sci.* 30, 299 (2000), which are incorporated herein by reference.

A production challenge that faces the development of a new generation of devices is the addition of noble metal films to MEMS. The use of noble metal films permits the fabrication of MEMS with greater complexity and functionality. For example, noble metal films may be used to add highly reflective optical surfaces, electrically conductive lines, bond pads, switch posts, electrodes, or long-lasting structures. However, the use of concentrated hydrofluoric acid during the release etch on such silicon/metal devices almost always causes problems. It is not uncommon for the poly-Si structural layers to dissolve or experience surface roughening in the presence of noble metal films. Furthermore, metal films will often delaminate during the release etch step due to undercutting of the underlying structural layer. Thus, etchant solution chemistries that prevent the degradation of structural layers during the release etch step are highly sought after.

SUMMARY OF THE INVENTION

The present invention is directed to a redox buffered hydrofluoric acid etchant and a method for using the etchant solution to reduce galvanic attack on structural layers during the release etching of MEMS devices with noble metal films. The etchant solution comprises an aqueous solution of water and hydrofluoric acid, and at least one redox buffer dissolved in the aqueous solution that maintains the redox potential of the etchant solution so that the redox buffer is preferentially oxidized over the structural material. The redox buffer can comprise a thiophosphoric-, thiophosphonic-, or thiophosphinic-acid, ester, or salt, or a poly thio-compound comprising a combination of these acids. The method comprises immersing the MEMS device in an etchant solution comprising water, hydrofluoric acid, and at least one redox buffer dissolved in the solution that maintains the redox potential of the solution so that the redox buffer is preferentially oxidized over the structural material.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers.

DETAILED DESCRIPTION OF THE INVENTION

Figure 1:
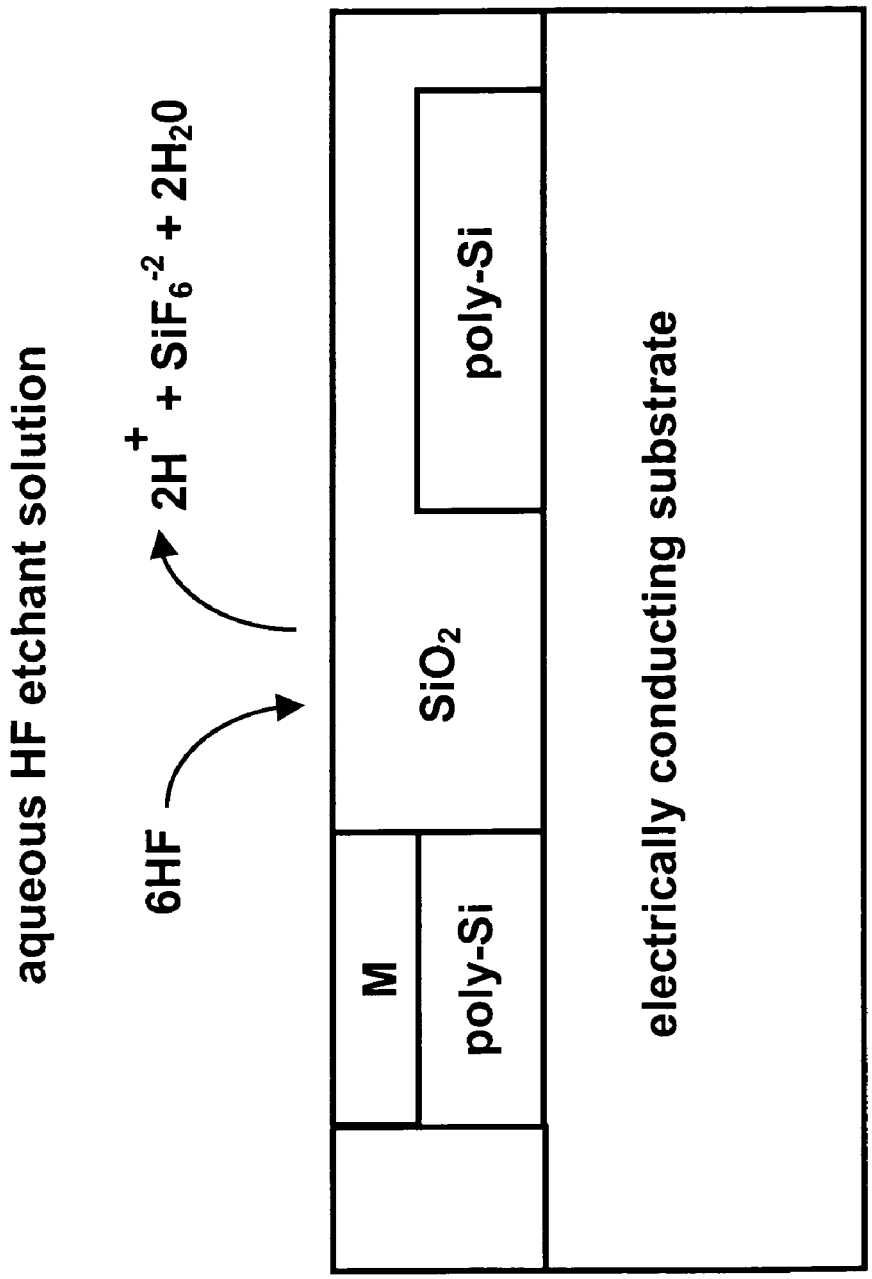
FIG. 1 shows a schematic illustration of the chemical etching of an unreleased MEMS structure, comprising a sacrificial $SiO_2$ layer covering a structural layer, comprising poly-Si with noble metal features, in a hydrofluoric acid solution.

In FIG. 1 is shown a schematic illustration of the chemical etching of an unreleased MEMS structure, comprising a sacrificial $SiO_2$ layer covering a structural layer comprising, poly-Si with noble metal features, in a hydrofluoric acid solution. The sacrificial oxide layer can be removed by chemical etching in an HF solution. The chemical etching of $SiO_2$ in HF solutions involves the adsorption of reaction species onto the surface, chemical reaction, and desorption of the reaction products. Among acids, only solutions containing hydrofluoric species are able to break the strong Si—O bond due to the high electronegativity of fluorine. The dissolution of silicon dioxide in aqueous HF occurs according to the overall chemical reaction $$SiO_2 + 6HF \longrightarrow 2H^+ + SiF_6^{2-} + 2H_2O \qquad (1)$$

The chemical etching of $SiO_2$ in HF has been reviewed by J. Buhler et al., "Silicon dioxide sacrificial layer etching in surface micromachining," *J. Micromech. Microeng.* 7, R1 (1997), which is incorporated herein by reference.

Without the addition of oxidizing agents, silicon is normally inert to chemical etching in HF, with a dissolution rate many orders of magnitude less than $SiO_2$. However, electrochemical dissolution can occur with the application of a positive anodic potential to the silicon. Indeed, such anodic etching is frequently used for making porous silicon, for oxide growth, and for electropolishing. Furthermore, a galvanic cell can be created whenever there is an ohmic contact between a more noble material, such as a noble metal, and a less noble material, such as silicon, in the presence of an ionic electrolyte. In the anodic reaction (oxidation), the less noble material (i.e., the material with the lower standard potential) is oxidized and often dissolves in the solution as ions. Reduction reactions (e.g., usually involving oxygen or hydrogen) occur at the cathode. Therefore, the noble cathode material is essentially protected from dissolution. Electrons released by the anodic reaction are conducted through the ohmic contact to the cathode, where they are consumed by the cathode reaction. The electrical circuit is closed by ion conduction through the electrolyte.

Figure 2:
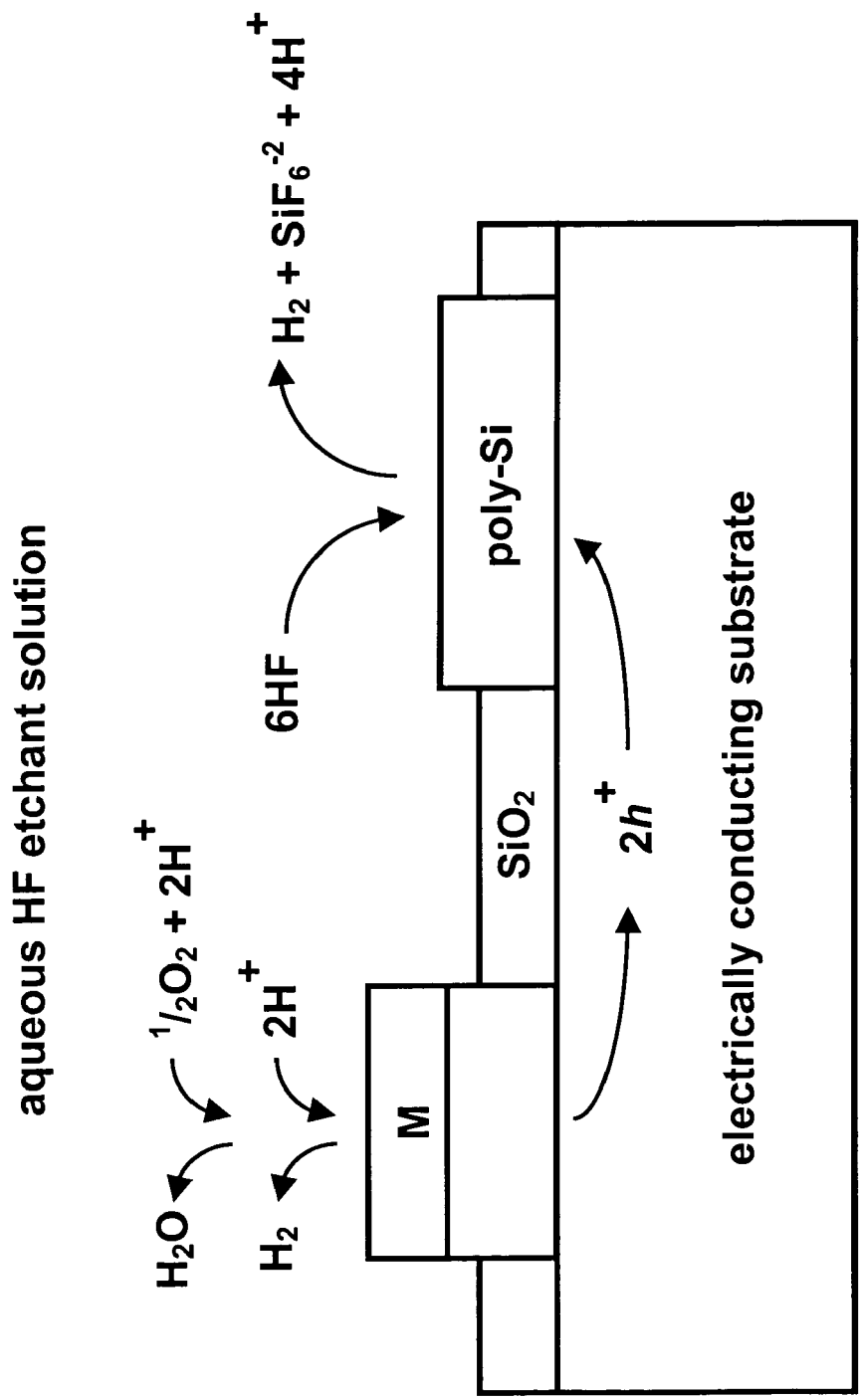
FIG. 2 shows a schematic illustration of the electrochemical etching of an exposed structural layer, comprising poly-Si with noble metal features, in a hydrofluoric acid solution.

In FIG. 2 is shown a schematic illustration of the electrochemical etching of an exposed structural layer, comprising a poly-Si feature in ohmic contact with a noble metal feature, in a hydrofluoric acid solution. The poly-Si anode in ohmic contact with the noble metal cathode immersed in the hydrofluoric acid electrolyte forms a galvanic cell. In general, the metal is more noble than the poly-Si (i.e., the metal has a higher standard reduction potential than poly-Si and is not easily oxidized during the release etch). Noble metals that might be used in MEMS devices include gold, silver, copper, and platinum. For example, gold has a standard potential of 1.50 V. Intrinsic silicon has a standard potential of −0.857 V. Therefore, silicon is a rather active element that is readily oxidized in water. Electrochemical dissolution of silicon in ohmic contact with the noble metal can occur in electrolytic solutions containing an oxidizing agent. However, the formation of an adherent oxide film on silicon effectively passivates silicon and prevents rapid oxidation of the bulk in water.

Anodic dissolution of silicon in HF solution can occur in the presence of noble metal films by various electrochemical pathways. The mechanism for galvanic corrosion of lightly doped silicon in the presence of a noble metal has been described in the literature. See J. J. Kelly et al., "Galvanic Cell Formation: A Review of Approaches to Silicon Etching for Sensor Fabrication," *IEEE Sensors Journal* 1(2), 127 (2001); X. H. Xia et al., "Galvanic Cell Formation in Silicon/Metal Contacts: The Effect on Silicon Surface Morphology," *Chem. Mater.* 12, 1671 (2000); and L. Torcheux et al., "Electrochemical Coupling Effects on the Corrosion of Silicon Samples in HF Solutions," *J. Electrochem. Soc.* 142(6), 2037 (1995), which are incorporated herein by reference. As shown in FIG. 2, at low potential, the anodic reaction requires only two valence band holes, according to $$Si + 2H^+ + 2h^* \longrightarrow Si^{4+} + H_2 \qquad (2)$$

$$Si^{4+} + 6HF \longrightarrow SiF_6^{2-} + 6H^+ \qquad (3)$$

In this instance, one $H_2$ molecule is formed for each silicon atom dissolved. Fluoride complexes the $Si^{4+}$ etching product, and the resulting silicon hexafluoride is soluble in concentrated acid solutions.

At higher positive potentials the reaction is dependent on the concentration of hydrofluoric acid and silicon dioxide as an intermediate product. Four holes are involved in the anodic reaction, according to $$Si + 2H_2O + 4h^+ \longrightarrow SiO_2 + 4H^+ \qquad (4)$$

$$SiO_2 + 6HF \longrightarrow SiF_6^{2-} + 2H_2O + 2H^+ \qquad (5)$$

The oxide is easily dissolved chemically by HF, according to reaction (1), resulting in electropolishing of the silicon surface.

A complimentary electrochemical reaction occurs with the reduction of hydrogen or oxygen at either the silicon or metal surface. Factors such as solution pH, fluoride concentration, silicon doping, and surface area directly influence the type of electrochemical cell that is formed and the chemical byproducts at each electrode. Since the over-potential for hydrogen ion reduction is generally minimized by the presence of a noble metal (especially platinum), the formation of a galvanic cell may easily occur when devices contain noble metal films. The phenomena results in the rapid dissolution of silicon structures. Hydrogen evolution is the dominant reaction in acidic aqueous solutions lacking other redox couples, but oxygen can be reduced as well according to:

$$O_2 + 4H^+ + 4e^- \longrightarrow 2H_2O \qquad (6)$$

Since oxygen has a limited solubility in aqueous solutions, this reduction reaction will normally be limited by diffusion.

When an ohmic contact is made between lightly doped p-type silicon and a metal, the Fermi levels of the two materials are positioned such that current carrying holes in the semiconductor are at high enough concentration to form an electrical pathway with the metal. Reduction of hydrogen at the silicon surface gives rise to a hole current from metal to semiconductor, causing silicon to dissolve according to reaction (4). Thus, galvanic cell formation is favored for p-type silicon in HF solutions A circuit comprising lightly doped n-type silicon and a metal is distinguished by the flow of electrons from the semiconductor to the metal. The reduction of chemical species at the metal surface causes the extraction of an electron at an energy level greater than 1 eV above the level of the valence band edge. In the semiconductor, this energy level is within the conduction band wherein the population of current-carrying species is insufficient to form an electrical pathway. Thus, galvanic cell formation is not favored for n-type silicon in HF solutions.

On the other hand, when n-type silicon is illuminated with light of sufficient energy, a sufficient number of current-carrying species is created in the conduction band to initiate current flow. In a similar manner, when the circuit comprises heavily doped or degeneratively doped n-type silicon, the conduction band is heavily populated with current-carrying species and current flow is analogous to the flow of electrons between contacting metals. This situation exists for many polysilicon surface micromachined MEMS that are constructed from degeneratively doped polysilicon structures. For example, the first layer of multi-layer polysilicon surface micromachined device is typically used as a ground plane and is composed of heavily doped material. This layer is especially susceptible to galvanic attack.

Although the standard potentials of the noble material and the less noble material establish the likelihood of dissimilar materials to corrode, the potential difference does not directly determine the rate of corrosion; instead, it is the galvanic current that determines corrosion rates. The effective current is related to a number of factors, including potential difference, temperature, chemical composition, electrolyte concentration, area ratio of the noble cathode to the less noble anode, and the passivation tendencies of the cathode and anode. Since currents are heavily influenced by reactant concentrations and electrode area, anodic dissolution will be lowest for a low concentration of a weak oxidizing agent or an exposed metal area that is small compared to the silicon area.

Various methods have been used to prevent galvanic corrosion in systems comprising dissimilar materials. Electrochemical methods for reducing anodic dissolution include selecting materials that do not corrode in the electrolyte, increasing the diffusion resistance of reactants or products by changing the hydrodynamic conditions or temperature of the electrolyte, removing reactants from the electrolyte, suppressing the adsorption of reactants by the addition of surfactants to the electrolyte, applying passivating coatings to the electrodes, and selecting an electrolyte that enhances passivation of the surface, such as hydroxide, which may help to form passivating oxides. Other electrical methods include preventing contact of the electrode materials with the electrolyte, applying a negative potential to the anode, increasing the ohmic resistance of the electrical contact by use of insulating materials, reducing the conductivity of the electrolyte, and reducing the area of the cathode relative to the anode or otherwise modifying the geometry of the galvanic couple. However, these preventative methods are generally impracticable for use during the release etch of MEMS devices.

Anticorrosion chemicals can also be added to the electrolytic solution to inhibit the cathodic or anodic reactions. In particular, a redox buffer can be used to suppress unwanted oxidation of an anodic material in a closed circuit with a noble metal. For example, redox buffers are used as antioxidants by biological systems to mitigate the damage of highly oxidizing species, as is observed with the natural production of glutathione and glutathione disulfide. Glutathione (gamma-glutamyl-cysteinyl-glycine or GSH) is a cysteine-containing tripeptide with reducing and nucleophilic properties which plays an important role in cellular protection from oxidative damage of lipids, proteins and nucleic acids. GSH regulates the metabolism of proteins and their activities by means of thiol-disulfide exchange. The sulfide groups on GSH oxidize readily and serve as a sacrificial getter of free radicals and highly oxidizing species. See, e.g., S. M. Deneke, "Thiol-Based Antioxidants," *Current Topics in Cellular Regulation* 36, 151 (2000).

Similar redox buffers can be used to mitigate unwanted oxidation of the structural layers during the release etch of MEMS devices. The redox buffer can be added as a soluble component to the HF etchant solution. For the redox buffer to work well in hydrofluoric acid, the buffer preferably possesses several characteristics. Foremost, the redox buffer molecule should be stable in a highly acidic environment with a high concentration of fluoride ion. Secondly, the redox buffer should be soluble at high enough concentrations to provide adequate buffering capacity at a specific redox potential. And lastly, the redox buffering potential that the material provides should provide preferential oxidation of the redox buffer over the structures being protected.

The redox buffers of the present invention comprise thio-phosphorous-based compounds. These compounds provide excellent buffering capacity and satisfy these other characteristics, also. The thio-phosphorous-based redox buffer molecule comprises one or more phosphorus core atoms with one or more sulfur atoms bonded to the phosphorus atom. The molecule need have only one sulfur in a low oxidation state, with either single or double bonds attached to the phosphorous atom. Although examples described herein have at least one sulfur atom double bonded to the phosphorus core atom, the double-bonded sulfur atom may be substituted with an oxygen atom. However, there must always be at least one sulfur atom present in the buffer molecule, whatever its position.

Figure 3:
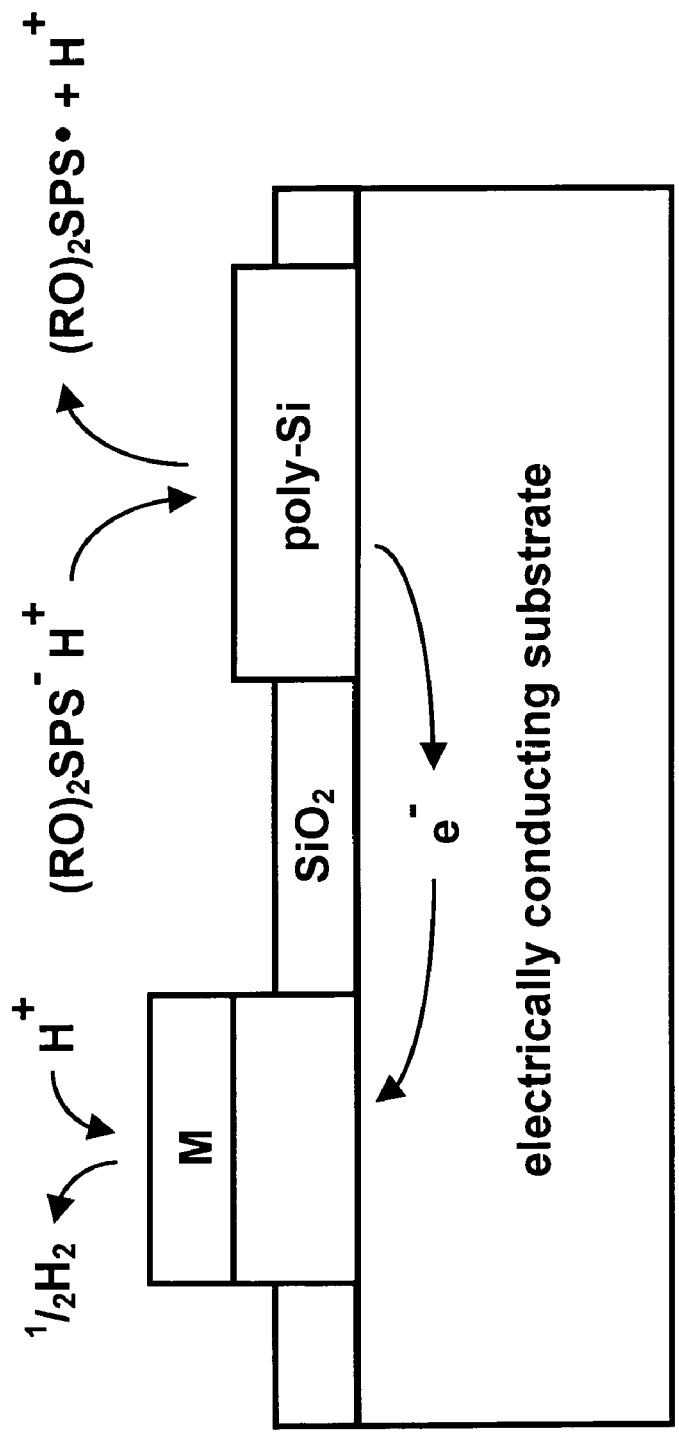
FIG. 3 shows a schematic illustration of the use of an exemplary dithiophosphoric acid redox buffer to suppress the anodic dissolution of the poly-Si feature in ohmic contact with the noble metal feature.

In FIG. 3 is shown a schematic illustration a probable mechanism for the suppression of the anodic dissolution of a poly-Si feature in ohmic contact with a noble metal feature using an exemplary dithiophosphoric acid redox buffer. The illustrated mechanism is not meant to be restrictive, and the dithiophosphoric acid molecule may alternatively oxidize along other chemical pathways in acidic solutions. The dithiophosphoric acid is dissolved in the hydrofluoric acid etchant solution. The sulfhydryl (—SH) group of the dithiophosphoric acid is easily oxidized. The sulfur atom of the sulfhydryl group is in a negative oxidation state. As hydrogen ion is reduced on the noble metal surface, the sulfhydryl group is electrochemically attracted to the anodic surface (i.e. poly-Si) where the sulfur atom is oxidized and gives up one or more electrons. Electrons are absorbed at the anode surface and flow through the conductive circuit to the inert metal surface where they combine with hydrogen ions to produce hydrogen gas. Thus, a sufficient supply of electrons is stored in the sulfide-containing additive to buffer the system at a chemical potential level that prevents oxidation of the exposed silicon. The oxidation products are also soluble in the hydrofluoric acid solution. Over time, the redox buffer additive is oxidized and the buffering capacity is no longer sufficient to prevent attack. When this occurs, more redox buffer can be added to the etch solution, or if the etch solution becomes too saturated with by-products, the bath can be remade. This protective mechanism begins as soon as structural poly-Si and noble metal layers are exposed and the galvanic cell is created. Concurrently, the hydrofluoric acid release etch solution continues to chemically etch the sacrificial oxide layer, exposing additional structural layer surfaces. Sacrificial oxide etch rates are not diminished and there is no noticeable attack or roughening of structural surfaces. Metal films remain solidly attached and do not delaminate.

The redox buffer preferably comprises a thiophosphoric acid, ester, or salt, due to their high solubility in HF solutions. The addition of the common phosphoric acid species (i.e., no sulfur atom present) to the release etch solution actually increases galvanic attack. In contrast, the thiophosphoric acids, esters or salts reduce galvanic attack. Thiophosphoric molecules can have one to four sulfur atoms attached to the core phosphorous atom. The general structural formulas for the thiophosphoric acids, esters, and salts is

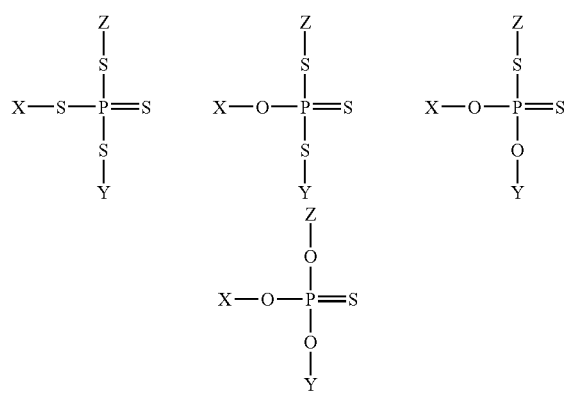

The pendants X, Y, and Z can be equivalent or dissimilar and can be hydrogen ion; a cation, such as sodium, ammonium, or potassium; a phenyl; or an alkyl, such as a methyl, ethyl, or butyl group. The pendants can comprise additional functionalities. For example, the alkyl pendant can comprise estero-alkyl, amino-alkyl, phenyl-alkyl, amido-alkyl, halo-alkyl, nitro-alkyl and so forth. Changing the pendant group does not change the fundamental nature of the protective mechanism. However, such changes may increase or decrease solubility and/or stability in hydrofluoric acid solutions. A preferred redox buffer is diethyl dithiophosphoric acid, which is available commercially at 90 percent purity. Sodium, ammonium, and potassium salts are also available at higher purity and also are effective in reducing galvanic attack.

Another suitable redox buffer comprises thiophosphonic acids, esters, and salts. Phosphonic compounds comprise an alkyl, halogen, or hydrogen atom attached directly to the phosphorus atom. Thus, these compounds contain one to three sulfur atoms attached to the phosphorous. The general structural formulas for the thiophosphonic acids, esters, and salts are

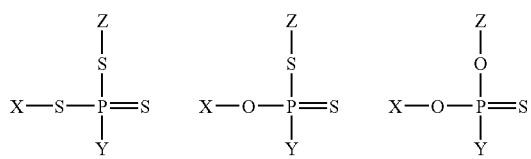

The pendant Y can be a halogen, such as chlorine; a hydrogen atom; or an alkyl group. The pendants X and Z may be equivalent or dissimilar and may be hydrogen ion; a cation, such as sodium, ammonium, or potassium; a phenyl; or an alkyl, such as a methyl, ethyl, or butyl group. The pendants can comprise additional functionalities. For example, the alkyl pendant can comprise estero-alkyl, amino-alkyl, phenyl-alkyl, amido-alkyl, halo-alkyl, nitro-alkyl and so forth. Compounds in this group also can reduce galvanic attack in MEMS devices, but fewer thiophosphonic compounds are available commercially.

Another suitable redox buffer comprises thiophosphinic acids, esters, and salts. The phosphinic group of compounds is similar to the other two groups, but is distinguished by having two alkyl groups, halogens, or hydrogen atoms attached directly to the phosphorus atom. The general structural formulas for the thiophosphinic acids, esters, and salts are

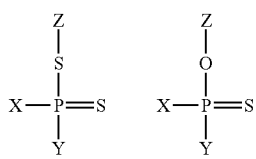

The pendants X and Y can be halogens, hydrogen atoms, or alkyl groups, and can be equivalent or dissimilar. The pendant Z can be a hydrogen ion; a cation, such as sodium, ammonium, or potassium; a phenyl; or an alkyl, such as a methyl, ethyl, or butyl group. The pendants can comprise additional functionalities. For example, the alkyl pendant can comprise estero-alkyl, amino-alkyl, phenyl-alkyl, amido-alkyl, halo-alkyl, nitro-alkyl and so forth. Some thiophosphinic compounds are available commercially.

Furthermore, poly-thio compounds of phosphoric, phosphonic, and phosphinic acids can provide suitable redox buffers. Such poly-compounds are numerous and possess properties similar to those of their mono-acid analogues. Phosphorus-based poly-acids contain more than one phosphorus atom with a plurality of alkyl, acid, or ester linkages. Poly thio-compounds of phosphoric, phosphonic and phosphinic acid compounds, with their esters and salts, contain at least one sulfur atom. Examples of linear or cyclic poly thio-compounds of phosphoric, phosphonic, and phosphinic acids, esters, and salts are

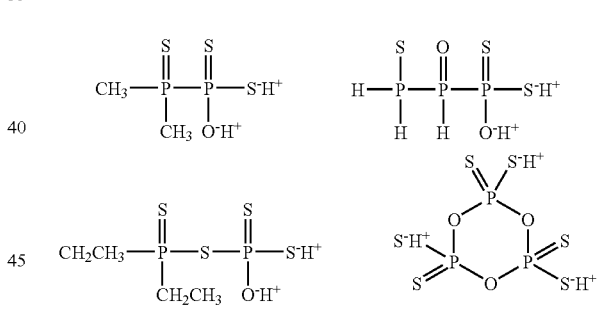

In general, one or more redox buffers can be added to the hydrofluoric acid solution to provide a release etch solution with adequate redox buffering capacity to prevent or minimize the dissolution or roughening of the structural layers of the MEMS device. The two primary components in the etchant solution are hydrofluoric acid and water. The concentration of hydrofluoric acid can be adjusted by the ratio of the primary components. Frequently, other acids and substances are added to the HF solution to better control etch rate, sensitivity, uniformity, and stability of solution composition. Therefore, the etchant solution can include additional mineral or organic acids or compounds, such as hydrochloric acid, nitric acid, phosphoric acid, phosphonic acid, phosphinic acid, oxalic acid, acetic acid, methanol, or isopropanol.

Although the invention has been described as a polysilicon micromachining process using $SiO_2$ as the sacrificial layer material, the redox buffers can be used with other sacrificial materials that are etched rapidly in hydrofluoric acid. MEMS structural materials typically comprise silicon, polysilicon, and silicon nitride. However, the structural layers can comprise other materials intended to be unaffected by the release-etch chemistries that can corrode in the presence of noble metals. Alternative structural materials include germanium, carbon, tungsten, molybdenum, hafnium, zirconium, titanium, nickel, or other metal, non-metal, nitride, oxide, or composite materials that do not etch quickly in hydrofluoric acid. The noble material layer can comprise gold, silver, copper, platinum, palladium, iridium, rhodium, osmium, ruthenium, rhenium, or any other metal or material (composite materials included) that provides a superior electrode surface for the reduction of species present in the etchant.

Furthermore, the redox buffers of the present invention can have utility for HF etchant solutions even when noble material layers are not present in the MEMS device structure. For example, structural layers can experience roughening due to the presence of metallic dopants in the structural layers or contaminants in the etchant solution. The polysilicon layers in the MEMS device may contain dopants at a level that results in surface roughening when a solution of hydrofluoric acid is used for the release-etch step. Furthermore, the electroless deposition of contaminants from an HF solution can provide sites that play the role of microcathodes, leading to pitting corrosion of a polysilicon surface. See, e.g., G. Oskam et al., "Electrochemical deposition of metals onto silicon," *J. Phys. D* 31, 1927 (1998). For these situations, the addition of a thio-phosphorus-based redox buffer of the present invention can reduce roughening by buffering oxidation on a microscopic scale.

Similarly, contaminants in glass or in etch solutions can cause unwanted roughening of non-silicon structures that are not intended to be etched. The addition of a thio-phosphorus redox buffer can reduce surface roughening on some materials such as nickel, tungsten, or stainless steel. Furthermore, redox buffers can provide more uniform etching of the glass and silicon oxide sacrificial layers. Microscopic images of etched silicon oxide indicate that the addition of a thio-phosphorus-based redox buffer to the etch solution produces a very uniform, smooth etch front.

MEMS-based electrical test structures (van der Pauw structures) made from poly-Si lines with attached gold films were used to investigate the hydrofluoric acid-based release etch chemistries. When these structures were etched in concentration hydrofluoric acid alone, a marked decrease in conductance of the poly-Si lines occurred, due to anodic dissolution of the poly-Si. In most cases, the poly-Si lines completely dissolved and the electrical circuit opened up. When the same test structure was etched in hydrofluoric acid containing diethyl dithiophosphate ammonium salt or diethyl dithiophosphoric acid, there was no change in the electrical properties of the poly-Si lines after a forty minute release etch. Moreover, there was no apparent increase in surface roughening as observed by microscopic imaging. Atomic force microscopy imaging indicated that the structures were well protected when these redox buffers were used in the HF etchant.

Figure 4:
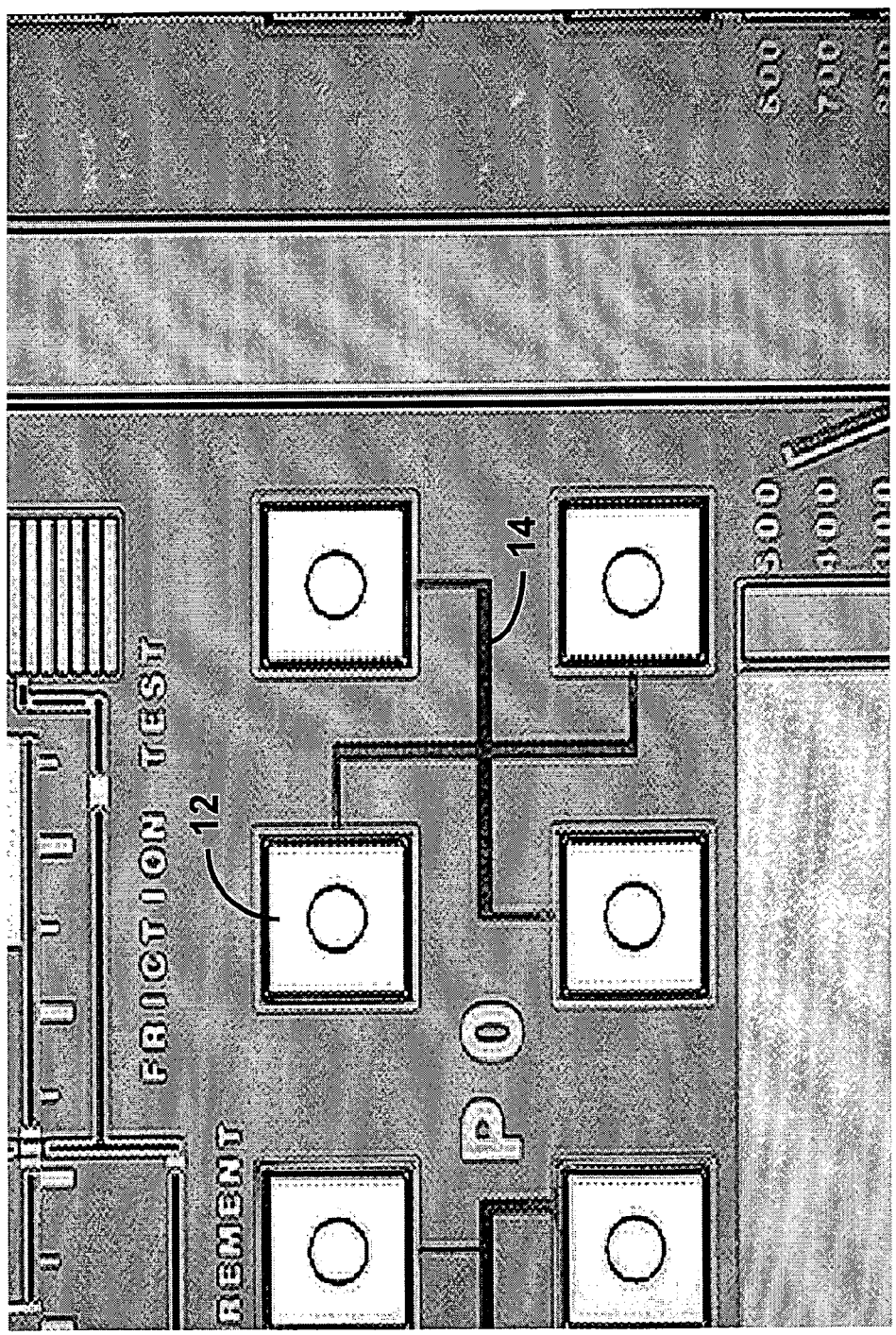
FIG. 4 shows a photomicrograph of an electrical test structure that was used for testing sheet resistance of a poly-Si layer with gold pads after a release etch in a standard HF etchant solution.

In FIG. 4 is shown an optical photomicrograph of a swastika-like electrical test structure that was used for testing sheet resistance of the primary poly-Si layer with gold pads 12 after a release etch in a standard HF etchant solution. During the wet HF release etch step, the poly-Si lines 14 were oxidized and turned dark in the photomicrograph. Sheet resistance measurements showed that these circuits were "opens", indicating that the poly-Si lines 14 were completely oxidized. The gold pads remained light colored.

Figure 5:
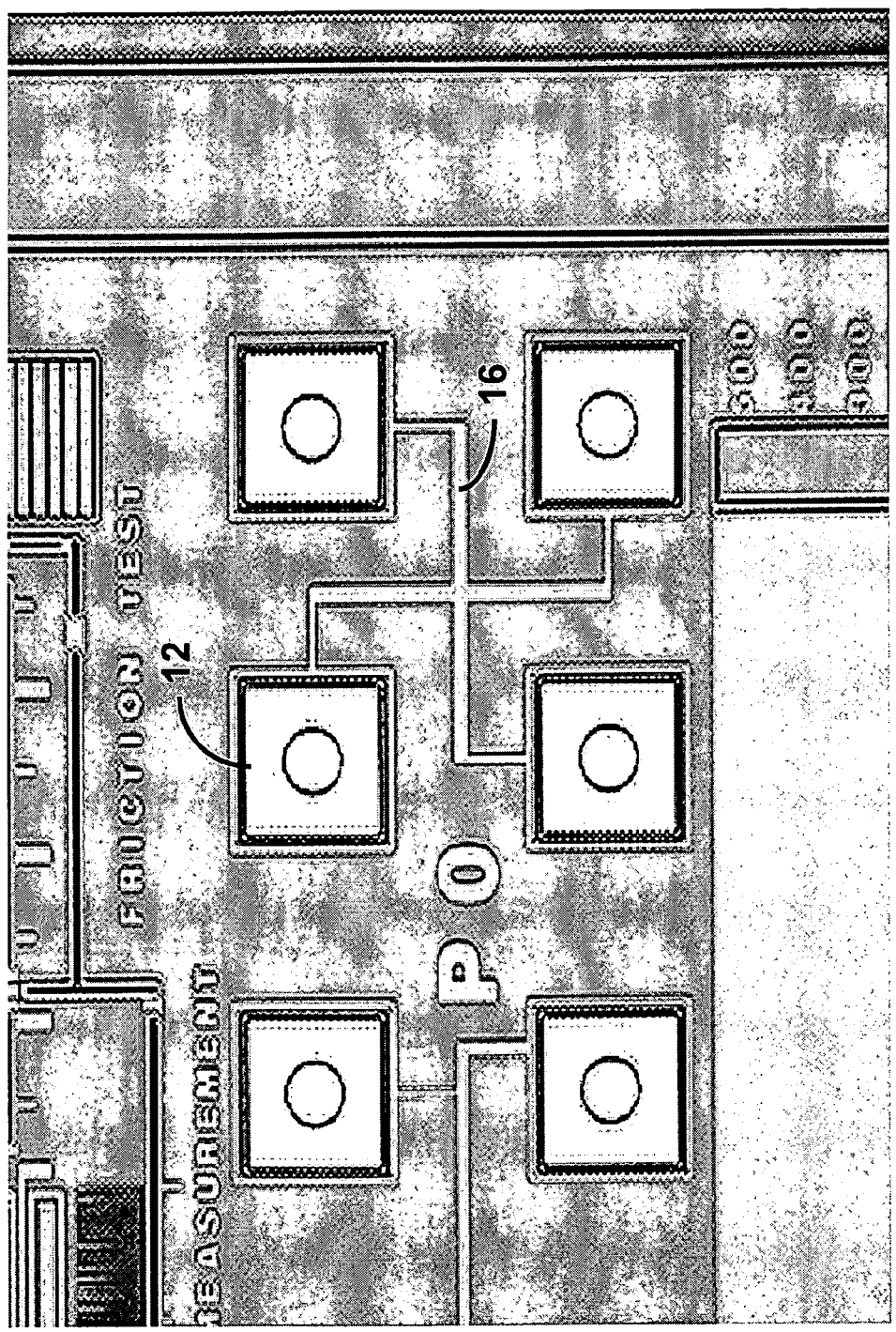
FIG. 5 shows a photomicrograph of the electrical test structure shown in FIG. 4 after a release etch in a dithiophosphoric acid redox-buffered HF etchant solution.

In FIG. 5 is shown a photomicrograph of the electrical test structure shown in FIG. 4 after a release etch in a dithiophosphoric acid redox-buffered HF solution. During the wet HF release etch step, the poly-Si did not oxidize when a small amount of diethyl dithiophosphate was added to the hydrofluoric acid etch solution, as indicated by the light-colored poly-Si lines 16. Sheet resistance measurements indicated that these circuits were the same resistance as unreleased devices.

The present invention has been described as a redox buffered hydrofluoric acid etchant for the reduction of galvanic attack on structural layers during the release etching of sacrificial layers of a MEMS device having noble material films. It will be understood that the above description is merely illustrative of the applications of the principles of the present invention, the scope of which is to be determined by the claims viewed in light of the specification. Other variants and modifications of the invention will be apparent to those of skill in the art.

I claim:

1. An etchant solution to reduce galvanic attack on a structural material during the release etching of a sacrificial material layer of a MEMS device having a noble material film, comprising:

an aqueous solution of water and hydrofluoric acid, and at least one redox buffer dissolved in the aqueous solution that maintains the redox potential of the etchant solution so that the redox buffer is preferentially oxidized over the structural material, wherein the at least one redox buffer comprises a thio-phosphorous-based compound comprising one or more phosphorous atoms and one or more sulfur atoms bonded to the phosphorous atom.

2. The etchant solution of claim 1, wherein the at least one redox buffer comprises a thiophosphoric acid, ester, or salt.

3. The etchant solution of claim 2, wherein thiophosphoric acid, ester, or salt has a general structural formula:

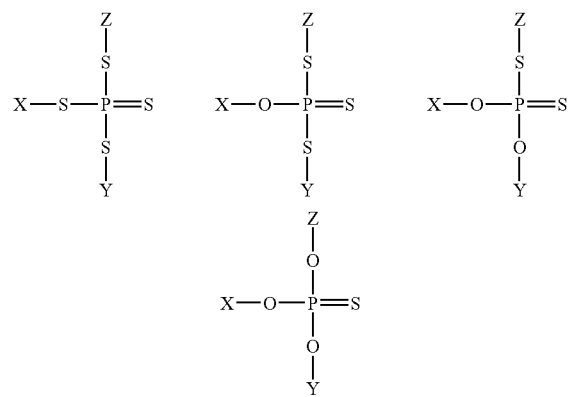

and wherein the pendants X, Y, and Z comprise a hydrogen ion, a cation, a phenyl, or an alkyl.

4. The etchant solution of claim 1, wherein the at least one redox buffer comprises a thiophosphoric acid, ester, or salt.

5. The etchant solution of claim 4, where the thiophosphoric acid, ester, or salt has a general structural formula:

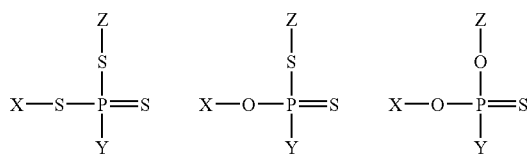

and wherein the pendant Y comprises a hydrogen atom, a halogen, or an alkyl group and the pendants X and Z comprise a hydrogen ion, a cation, a phenyl, or an alkyl.

6. The etchant solution of claim 1, wherein the at least one redox buffer comprises a thiophosphinic acid, ester, or salt.

7. The etchant solution of claim 6, wherein the thiophosphinic acid, ester, or salt has a general structural formula:

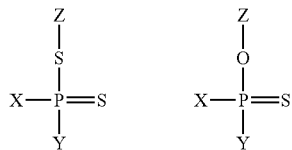

and wherein the pendants X and Y comprise halogen, hydrogen atom, or alkyl group, and the pendant Z comprises a hydrogen ion, a cation, a phenyl, or an alkyl.

8. The etchant solution of claim 1, wherein the at least one redox buffer comprises a poly thio-compound comprising at least two phosphoric, phosphonic, or phosphinic acids or a combination thereof.

9. The etchant solution of claim 8, wherein the poly thio-compound comprises a linear or cyclic compound.

10. The etchant solution of claim 9, wherein the poly thio-compound comprises:

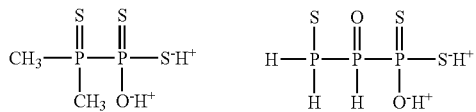

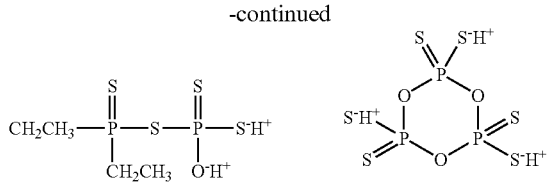

11. The etchant solution of claim 1, further comprising a mineral or organic acid.

12. The etchant solution of claim 11, wherein the acid comprises hydrochloric acid, nitric acid, phosphoric acid, phosphonic acid, phosphinic acid, oxalic acid, acetic acid, methanol, or isopropanol.

13. The etchant solution of claim 1, wherein the structural material has a lower standard potential than the noble material.

14. The etchant solution of claim 1, wherein the structural material comprises silicon, polysilicon, or silicon nitride.

15. The etchant solution of claim 1, wherein the structural material comprises germanium, carbon, tungsten, molybdenum, hafnium, zirconium, titanium, or nickel.

16. The etchant solution of claim 1, wherein the structural material comprises a metal, non-metal, nitride, oxide, or composite that does not etch quickly in hydrofluoric acid.

17. The etchant solution of claim 1, wherein the sacrificial material comprises silicon dioxide.

18. The etchant solution of claim 1, wherein the noble material comprises gold, silver, copper, platinum, palladium, iridium, rhodium, osmium, ruthenium, or rhenium.

19. The etchant solution of claim 1, wherein the noble material comprises a metal or material that provides a superior electrode surface to the structural material for the reduction of hydrogen ions or other species that can be oxidized.

* * * * *